United States Patent
Kurisu et al.

(10) Patent No.: US 6,338,804 B1
(45) Date of Patent: Jan. 15, 2002

(54) METHOD FOR REMOVING CONDUCTIVE PORTIONS

(75) Inventors: Toru Kurisu, Omihachiman; Takashi Ikemoto, Shiga-ken, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/370,481

(22) Filed: Aug. 9, 1999

(30) Foreign Application Priority Data

Aug. 24, 1998 (JP) .......................................... 10-237405

(51) Int. Cl.[7] .................................................. B44C 1/22
(52) U.S. Cl. .......................................... 216/65; 438/690
(58) Field of Search .............................. 216/65, 66, 75, 216/76, 79; 438/690, 707, 720; 427/554, 555, 556

(56) References Cited

U.S. PATENT DOCUMENTS

| | | |
|---|---|---|
| 4,092,515 A | 5/1978 | Joslin et al. |
| 4,680,855 A * | 7/1987 | Yamazaki et al. ........ 216/65 X |
| 4,957,589 A * | 9/1990 | Yamada ..................... 216/65 X |
| 5,257,706 A | 11/1993 | McIntyre |
| 5,580,473 A | 12/1996 | Shinohara et al. |
| 5,759,428 A | 6/1998 | Balamane et al. ...... 219/121.66 |
| 6,074,571 A * | 6/2000 | Smolinski ................. 216/65 X |
| 6,149,988 A * | 11/2000 | Shinohara et al. ........ 216/65 X |

FOREIGN PATENT DOCUMENTS

| | | |
|---|---|---|
| DE | 41 08 541 | 9/1992 |
| DE | 19 50 8497 | 9/1995 |
| JP | 6-350314 | 12/1994 |
| JP | 91-62607 | 6/1997 |
| WO | 98/20527 | 5/1998 |

OTHER PUBLICATIONS

U.K. Search Report issued Oct. 18, 1999 in a related application.

* cited by examiner

Primary Examiner—William A. Powell
(74) Attorney, Agent, or Firm—Ostrolenk, Faber, Gerb & Soffen, LLP

(57) ABSTRACT

There is provided a method for removing conductive portions, comprising the steps of: a first process for removing a conductive portion formed on a dielectric using a laser; and a second process for removing an affected layer produced in the removed portion by the laser using a short pulse laser. According to the above described method, the number of steps therein is reduced, conductive portions are removed without using a large number of apparatuses, and deterioration of "$Q_o$" does not occur.

12 Claims, 3 Drawing Sheets

SECOND HARMONIC YAG LASER

YAG SHORT PULSE LASER

SECOND HARMONIC YAG LASER

YAG SHORT PULSE LASER

METHOD FOR REMOVING CONDUCTIVE PORTIONS

BACKGROUND OF THE INVENTION

1. Field of the Invention

The present invention relates to a method for removing conductive portions formed on surfaces of dielectric resonators used in oscillators, filters, duplexers, etc., and on surfaces of dielectric substrates.

2. Description of the Related Art

FIG. 4 shows a dielectric resonator for use in an oscillator or a filter. A dielectric resonator 10 is formed of a rectangular prism-shaped dielectric 11 having a through-hole 12, an outer conductor 13 formed on the external surfaces thereof except for one end in which the through-hole 12 is formed, an inner conductor 14 formed on the inner peripheral surface of the through-hole 12, an input-output electrode 15 formed in the vicinity of an open end in which a conductive portion is not formed, and a connecting conductor 16 which connects the input-output electrode 15 to the inner conductor 14. As a method for forming a dielectric resonator having the above-mentioned structure, there is a method in which a predetermined portion of conductive portions are removed after forming of the conductive portions by copper plating, for example, on the entirety of the surfaces of a rectangular prism-shaped dielectric having a through-hole.

Furthermore, as a specific method for removing conductive portions of a dielectric resonator, a removing method using a laser is effective because the removal can be precisely achieved for arbitrary shapes using a polarizing mirror which is not in contact with the dielectric resonator. A characteristic adjustment such as a frequency adjustment can also be achieved by removing a portion of conductive portions by a laser.

Referring to a process diagram shown in FIG. 5, a conventional method for removing conductive portions will now be described.

As a first process, a predetermined portion of conductive portions is removed using a YAG laser. When a conductive portion is removed using a laser such as a YAG laser, a dielectric and a conductive portion fused by intense heat of the laser are solidified and the electric resistance thereof is decreased so that affected layers are produced, and the dielectric is rapidly quenched from a high temperature so as to be reduced by oxygen deficiency so that semi-conductive affected layers are produced. When such an affected layer is produced, no-load "Q" (referred as "$Q_o$" below) of the dielectric resonator is deteriorated. Accordingly, in a second process, the affected layer, having decreased electric resistance, is etched using dilute sulfuric acid so that the deteriorated "$Q_o$" is improved.

As a third process, the semi-conductive affected layer due to a reducing reaction is re-oxidized by a heat-treatment in air atmosphere. Since the conductive portion, which is not essentially to be oxidized, is oxidized in the third process, an oxidized conductive portion is etched using dilute sulfuric acid in a fourth process. By being subjected to these processes, the dielectric resonator 10 shown in FIG. 4 can be obtained.

In a conventional method for removing conductive portions, utilization of the first to fourth processes is required, so that the number of manufacturing steps is increased. Removing the conductive portion by a laser in the first process, etching by dilute sulfuric acid in the second and fourth processes, and heat treating for re-oxidizing the semi-conductive affected layer due to a reducing reaction in the third process must be performed, using different equipment, resulting in reduced productivity.

SUMMARY OF THE INVENTION

To overcome the above described problems, preferred embodiments of the present invention provide a method for removing conductive portions, which does not require a large number of pieces of equipment, and which does not cause deterioration of the "$Q_o$" of a dielectric resonator, etc., by solving those problems.

One preferred embodiment of the present invention provides a method for removing conductive portions, comprising the steps of: a first process for removing a conductive portion formed on a dielectric using a laser; and a second process for removing an affected layer produced in the removed portion by the laser using a short pulse laser.

A short pulse laser has an extremely short pulse duration and is thereby able to remove the affected layer without thermal load. That is, the affected layer can be removed without using a large number of apparatuses, so that a dielectric resonator with a non-deteriorated "$Q_o$", etc., can be easily produced.

In the above described method, the laser used in the first process may be a harmonic YAG laser.

When a harmonic YAG laser, such as a second harmonic YAG laser having double the frequency and one-half the wavelength, and a fourth harmonic YAG laser having four times the frequency and one-quarter the wavelength are used, the accuracy is improved due to a reduced wavelength, and the thermal load is also reduced.

In the above described method, the laser used in the first process may be a second harmonic YAG laser.

When a second harmonic YAG laser among harmonic YAG lasers is used, an appropriate output-power can be obtained while maintaining sufficient accuracy.

In the above described method, the short pulse laser used in the second process may be a YAG short pulse laser.

Among short pulse lasers, the YAG short pulse laser achieves high amplification gain utilizing a crystalline solid so as to have features of high oscillating output-power, stable performance, etc., resulting in increased productivity.

In the above described method, a gas including oxygen may be supplied to the removing conductive portion in the first process.

Thereby, the semi-conductive dielectric reduced by oxygen deficiency can be reduced so that the portion removed by the short pulse laser is reduced, resulting in further increased productivity.

Other features and advantages of the present invention will become apparent from the following description of the invention which refers to the accompanying drawings.

DESCRIPTION OF THE PREFERRED EMBODIMENTS

Figure 2:
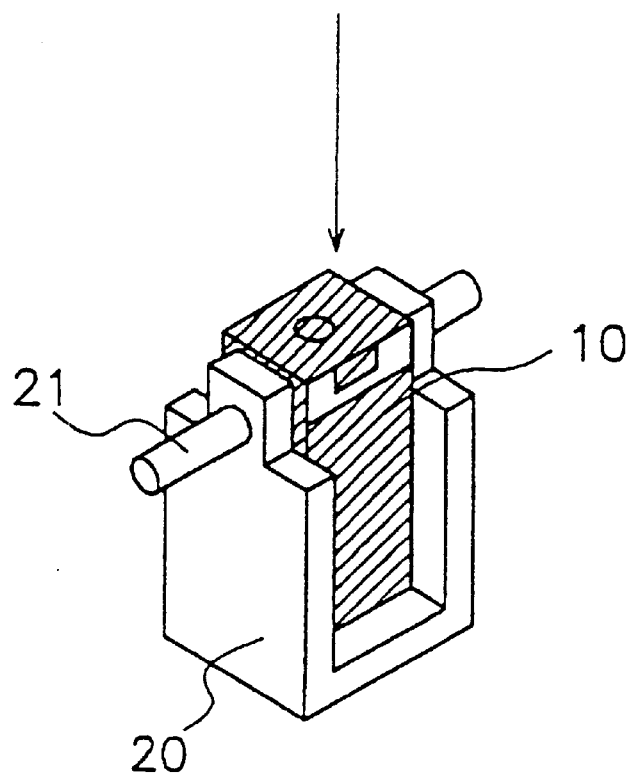
FIG. 2 is a schematic view showing a method for removing a surface to be an open-end surface.
Figure 3:
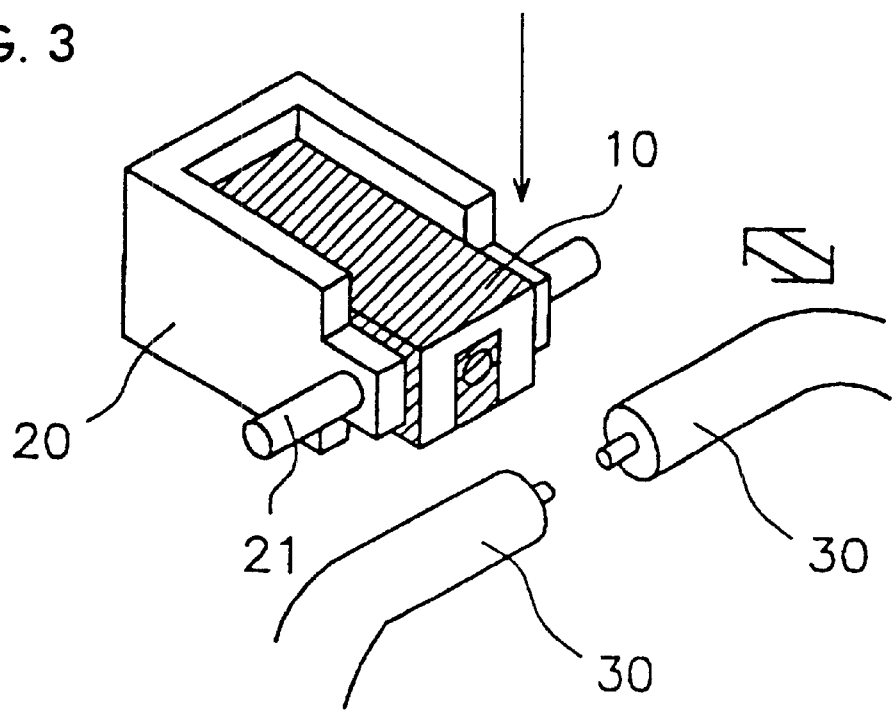
FIG. 3 is a schematic view showing a removing method for the characteristic adjustment.
Figure 4:
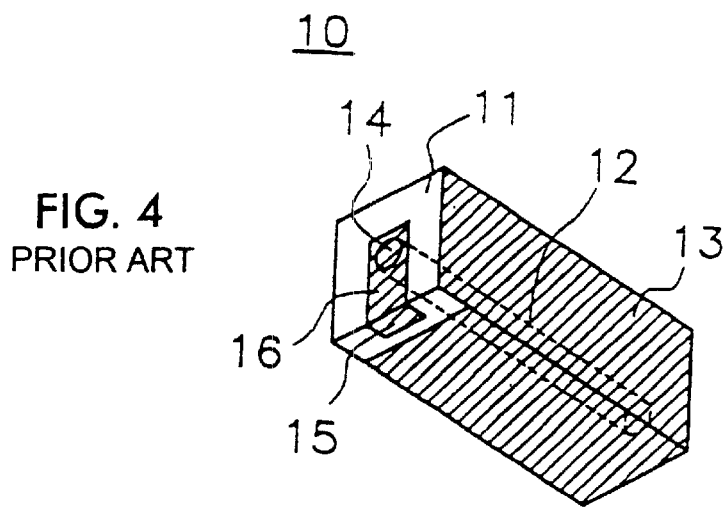
FIG. 4 is a schematic view of a dielectric resonator.
Figure 5:
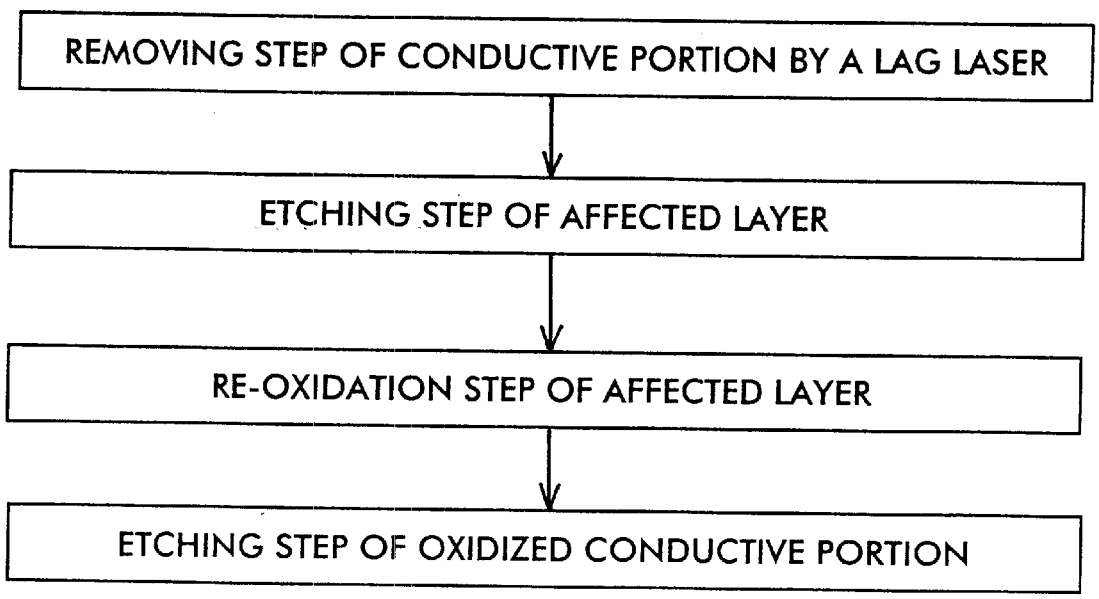
FIG. 5 is a process diagram showing a prior method for removing conductive portions.

Referring to FIGS. 1A, 1B, 2 and 3, a method for removing conductive portions according to a preferred embodiment of the present invention will now described with a dielectric resonator shown in FIG. 4 as an example.

Figure 1A:
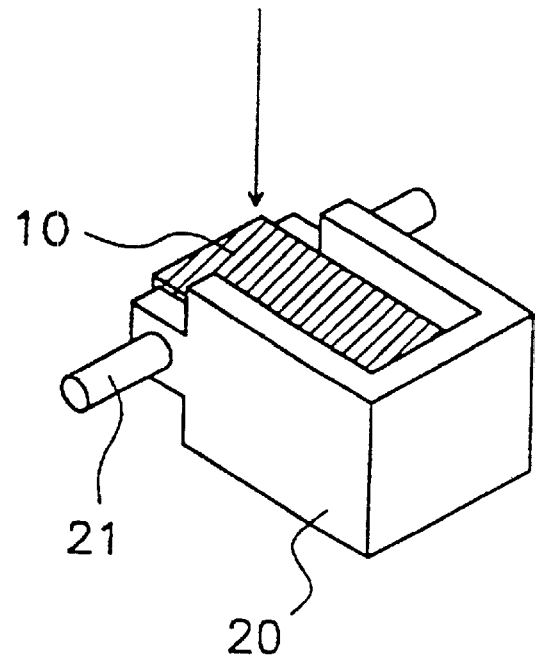
FIG. 1A is a schematic view showing a method for removing conductive portion in a first process.

As shown in FIG. 1A, a dielectric resonator 10 plated with copper on the entirety of the surfaces thereof is held by a holder 20 being rotatable by a rotation axis 21, and the direction of the holder 20 is adjusted to be set so that a surface of the dielectric resonator on which an input-output electrode is to be formed is irradiated by a laser. As a laser apparatus, a second harmonic YAG laser oscillator and a short pulse laser oscillator are disposed within the same apparatus such that any one of those lasers can selectively be used by changing an angle thereof using a mirror, a polarizing mirror, etc.

As a first process, for forming an input-output electrode, a second harmonic YAG laser is used to form an insulating portion. As a second harmonic YAG laser, a laser with a pulse width of 50 to 100 nm and with a pulse frequency of 1 to 3 kHz is used. At this process, on a portion irradiated by the laser, affected layers are produced in which a dielectric and a conductive portion fused by intense heat of the laser are solidified and the electrical resistance thereof is reduced, and semi-conductive affected layers are produced in which the dielectric is rapidly quenched from a high temperature so as to be reduced by oxygen deficiency. When such affected layers are produced, "$Q_o$" is deteriorated so that the characteristics of the dielectric resonator are degraded. In addition, at this time, when a second harmonic YAG laser accompanied by supplying a gas including oxygen is used, the magnitude of the semi-conductive affected layer due to a reducing reaction can be reduced.

Figure 1B:
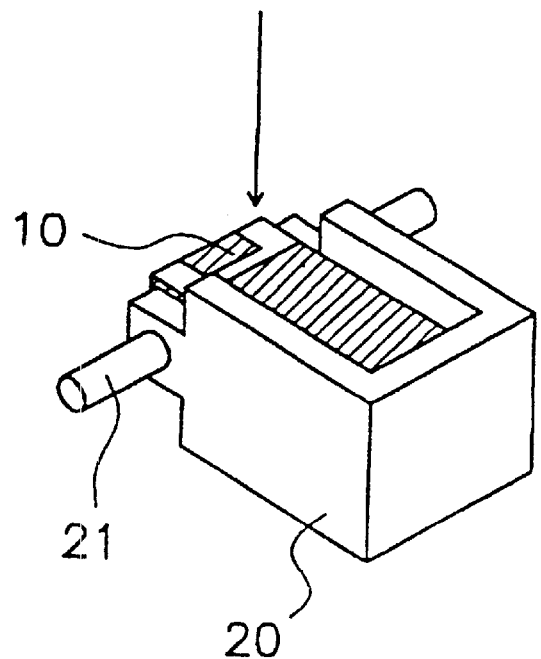
FIG. 1B is a schematic view showing a method for removing the affected layer in a second process.

As shown in FIG. 1B, as a second process, a portion in which the affected layer is produced is irradiated by a YAG short pulse laser. As a YAG short pulse laser, a laser with a pulse width of lass than 10 nm and with a pulse frequency of less than 20 Hz is used. Since such a short pulse laser is much smaller in pulse width and lower in pulse frequency in comparison with the laser used in the first process, it can remove the affected layer without thermally affecting the dielectric resonator 10. Therefore, the dielectric resonator 10 with reduced deterioration "$Q_o$" can be produced without using a large number of apparatuses.

On the prevention of deterioration of the "$Q_o$" by the combined use of a laser with the short pulse laser for removing, a description will now be made on the basis of an experimental result. Two dielectric resonators were prepared in which the entire surfaces thereof were formed by conductive portions, except for one end in which a through-hole was formed as an open end in advance. A part of the outer conductor on four surfaces with a width of 0.5 mm from the open end was removed for each of the dielectric resonators. For a first dielectric resonator, the part was removed using only the second harmonic YAG laser, while for a second dielectric resonator, after the part was removed by the second harmonic YAG laser, the affected layer thereof was removed by the short pulse laser. When "$Q_o$"s of these dielectric resonators were measured, the "$Q_o$" of the first dielectric resonator was reduced by 40.8% compared with that before removing, while the "$Q_o$" of the second dielectric resonator was reduced only by 7.3%. That is, when the affected layer produced in the first process was removed using the short pulse laser in accordance with the present invention, reduction of deterioration of "$Q_o$" was confirmed from this experimental result.

Then, as shown in FIG. 2, the conductive portion on the surface to be an open end was removed by rotating the holder 20 in the same manner as described above, through the first and second processes. Furthermore, as shown in FIG. 3, in order to adjust a characteristic such as a resonant frequency, the conductive portion is removed by rotating the holder 20 through the first and second processes. At this time, as shown in FIG. 3, the characteristic of the dielectric resonator 10 is adjusted being accompanied by measuring a resonant frequency of the dielectric resonator 10 by moving a measuring probe for measuring a resonant frequency toward the dielectric resonator 10.

In this embodiment, the conductive portion of a dielectric resonator is removed; the invention can be applied to removing conductive portions on an integral-type dielectric filter in which plural through-holes are formed on one dielectric block to form input-output electrodes thereon and on a dielectric substrate. As for a laser used in the first process, an excimer laser and a $CO_2$ laser may also be used. In addition, the invention also has the effect of improving the outward appearance by removing the black affected layer.

In accordance with the present invention as described above, using a laser and a short pulse laser which can be disposed within one apparatus, the conductive portion is removed by the laser in the first process and the affected layer produced in the first process is removed by the short pulse laser. Accordingly, the conductive portions can be removed without using a large number of manufacturing apparatuses, resulting in improved productivity. Simultaneously, the invention has characteristic advantages such as reduced deterioration of a "$Q_o$" of a dielectric resonator, etc.

While the invention has been particularly shown and described with reference to preferred embodiments thereof, it will be understood by those skilled in the art that the forgoing and other changes in form and details may be made therein without departing from the spirit of the invention.

What is claimed is:

1. A method for removing conductive portions, comprising the steps of:
    a first process for removing a conductive portion formed on a dielectric using a laser; and
    a second process for removing an affected layer produced in the removed portion by the laser using a short pulse laser.

2. The method according to claim 1, wherein the laser used in the first process is a harmonic YAG laser.

3. The method according to claim 2, wherein the laser used in the first process is a second harmonic YAG laser.

4. The method according to claim 1, wherein the short pulse laser used in the second process is a YAG short pulse laser.

5. The method according to claim 2, wherein the short pulse laser used in the second process is a YAG short pulse laser.

6. The method according to claim 3, wherein the short pulse laser used in the second process is a YAG short pulse laser.

7. The method according to claim 1, wherein a gas including oxygen is supplied to the removing conductive portion in the first process.

8. The method according to claim 2, wherein a gas including oxygen is supplied to the removing conductive portion in the first process.

9. The method according to claim 3, wherein a gas including oxygen is supplied to the removing conductive portion in the first process.

10. The method according to claim 4, wherein a gas including oxygen is supplied to the removing conductive portion in the first process.

11. The method according to claim 5, wherein a gas including oxygen is supplied to the removing conductive portion in the first process.

12. The method according to claim 6, wherein a gas including oxygen is supplied to the removing conductive portion in the first process.

* * * * *